United States Patent [19]
Kim

[11] Patent Number: 5,977,557
[45] Date of Patent: Nov. 2, 1999

[54] HOT-ELECTRON PHOTO TRANSISTOR

[75] Inventor: Gyung Ock Kim, Daejon-shi, Rep. of Korea

[73] Assignee: Electronics & Telecommunications Research Institute, Daejeon, Rep. of Korea

[21] Appl. No.: 09/145,738

[22] Filed: Sep. 2, 1998

[30] Foreign Application Priority Data

Dec. 23, 1997 [KR] Rep. of Korea .................. 97-72760

[51] Int. Cl.⁶ .................................................. H01L 29/06
[52] U.S. Cl. ............................... 257/21; 257/24; 257/25; 257/462
[58] Field of Search ............................ 257/14, 17, 21, 257/25, 184, 187, 197, 462, 24

[56] References Cited

U.S. PATENT DOCUMENTS

| | | | |
|---|---|---|---|
| 5,047,810 | 9/1991 | Chemla et al. | 257/14 |
| 5,077,593 | 12/1991 | Sato et al. | 257/14 |
| 5,198,659 | 3/1993 | Smith et al. | 257/17 |
| 5,384,469 | 1/1995 | Choi | 257/21 |

FOREIGN PATENT DOCUMENTS 0638941  2/1995  European Pat. Off. .

OTHER PUBLICATIONS

Victor Ryzhii and Maxim Ershov; Hot Electron Effects in Infrared Multiple–Quantum–Well Phototransistor; Feb. 1995; pp. 1257–1259, J. Appl. Phys. vol. 34.

V. Ryzhii and M. Ershov; Electron density modulation effect in a quantum–well infrared phototransistor; Jul. 1995; pp. 1214–1218, J. Appl. Phys. 78(2).

L.C. Lenchyshyn, H.C. Liu, M. Buchanan and Z.R. Wasilewski; Voltage–tuning in multi–color quantum well infrared photodector stacks; May 1996, pp. 8091–8097, Appl. Phys. 79(10).

*Primary Examiner*—Minh Loan Tran
*Attorney, Agent, or Firm*—Antonelli, Terry, Stout & Kraus, LLP

[57] ABSTRACT

The present invention is related to a hot-electron photo transistor. By applying the combination of quantum dots or quantum wires with sizes, the wide spacer layers, and the blocking layers to the electron injecting barrier of the emitter, the wide range of infrared detection can be attained and the resolution of detected infrared wavelength can be increased. And by introducing the resonant tunneling quantum well structure to the base layer the selection, amplification and processing of the specific infrared frequency is possible and the reduction of the dark current is induced. Therefore, the present invention is applicable to ultra-high speed tunable infrared detectors and amplifiers, ultra-high speed switching and logic devices, high speed infrared logic devices with new features, new high-speed infrared logic devices which can reduce the number of logic devices.

10 Claims, 3 Drawing Sheets

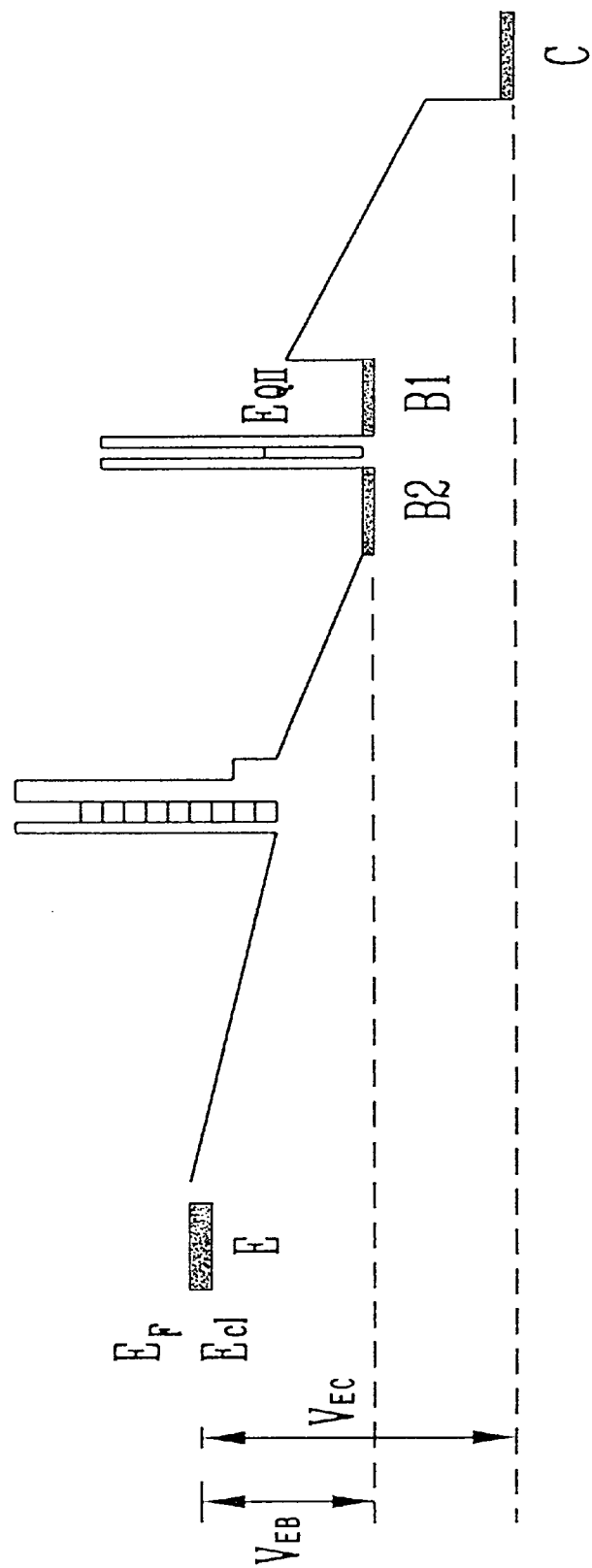

HOT-ELECTRON PHOTO TRANSISTOR

BACKGROUND OF THE INVENTION

1. Field of the Invention

The present invention relates to a heterostructure infrared hot-electron transistor (HET), specifically to a hot-electron photo transistor (HEPT) which has a wide-range infrared detection feature by applying combination of quantum dot or quantum wire arrays of various sizes as an emitter electron injecting barrier (emitter barrier), and which has an increased resolution of detected infrared wavelength, and which selectively amplifies and processes infrared signal of specific frequencies using a resonant tunneling quantum well structure, and which induces reduction of dark currents.

2. Description of the Related Art

Semiconductor devices utilizing heterostructure have been actively developed as semiconductor growth technologies such as the molecular beam epitaxy (MBE), the metal organic compound vapor deposition (MOCVD) are being advanced. Active researches are in progress on the phenomena of absorbing or emitting lights in the range of infrared caused by electron transitions between quantum-confined states of electrons or holes in the structures of quantum wells, quantum wires, or quantum dots of GaSb/InAs, InAs/ZnTe, GaAs/Al(Ga)As, InGaAs/InAlAs/InP etc, due to the energy band line-up of the semiconductor hetero junction structures, and on the resonant tunneling effect of electrons through quantum-confined states, and on the significantly rapid electron moving effect of hot-electrons in the heterostructure. Also in progress are researches to integrate the ultra-high speed infrared photo detection and generation utilizing inter-subband transitions of electrons and the ultra-high speed electron effect utilizing the significantly short transit time of hot-electrons in transistor structures.

The utilization of the quantum resonant tunneling effect and the significantly short transit time of hot-electrons can make tera-hertz operation of the devices possible. Devices like hot-electron transistors (HET), resonant tunneling hot-electron transistors (RHET), resonant tunneling diodes (RTD) etc, can be operated in tera-hertz range (far infrared range). A lot of interests are focused to tunable voltage-controlled photodetectors which can absorb, detect and generate infrared ray utilizing the heterostructure quantum well, quantum wire, quantum dot structures, and to hot-electron photo transistors utilizing the significantly rapid transit time of hot-electrons in the base area. In particular, the utilization of the electron resonant tunneling through quantum-confined states with ultra-high speed and the electron transition between quantum-confined states has technological significance in the applications to ultra-high speed switching devices and logic devices.

SUMMARY OF THE INVENTION

It is therefore an object of the present invention to provide a hot-electron photo transistor, which is applicable to photodetectors, amplifiers, switching and infrared logic devices being able to detect wide-range of infrared and having increased resolution of detecting infrared wavelength by applying the combination of quantum dots or quantum wire arrays and a spacer layer to the emitter electron injecting barrier, and being able to select, amplify, and process the specific infrared frequency signals with base voltage by introducing the resonant tunneling quantum well structure to the base layer.

To achieve the above-mentioned purpose, the hot-electron phototransistor according to the present invention comprises a conductive-type collector layer and a collector barrier formed sequentially on the top of a substrate; a first conductive-type base layer, a resonant tunneling quantum well structure, and a second conductive-type base layer formed sequentially on the top of said collector barrier; an emitter electron injecting barrier formed by stacking sequentially a first non-conductive type spacer layer, a blocking barrier, a quantum dot array combination structure or a quantum wire array combination structure, and a second non-conductive type spacer layer on the top of said second conductive-type base layer; a conductive-type emitter layer formed on the top of said emitter electron injecting barrier.

BRIEF DESCRIPTION OF THE DRAWINGS

The objects, features and advantages of the present invention will be apparent to one skilled in the art from the following detailed description in conjunction with the accompanying drawings, in which:

FIG. 2a and 2b show the energy band illustrating conduction bands in each layer under respective voltages of the hot-electron photo transistor according to the present invention.

DETAILED DESCRIPTION OF THE INVENTION

Now, detailed description of the present invention follows referring to the attached figures.

Figure 1A:
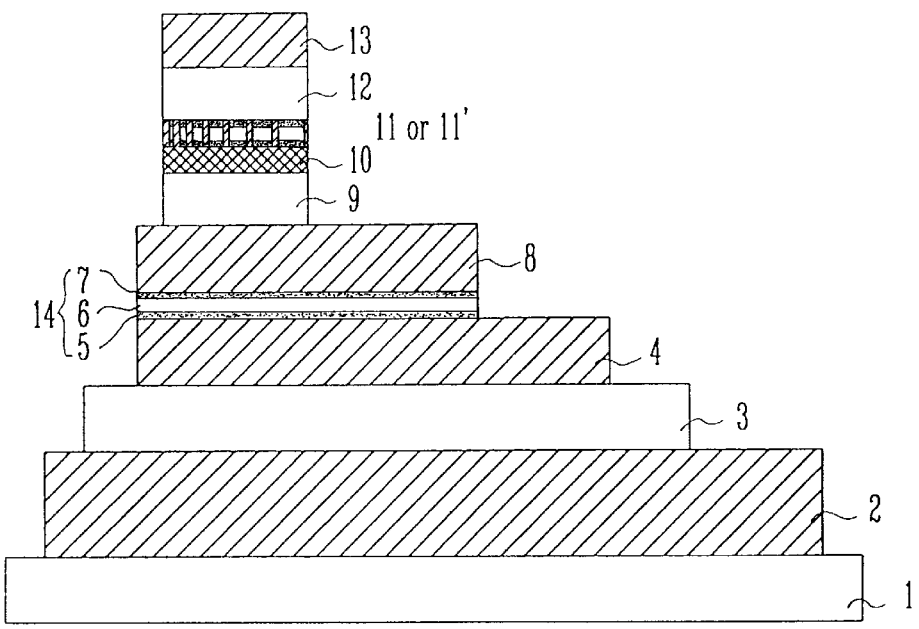
FIG. 1a is a sectional view of the hot-electron phototransistor according to the present invention.

FIG. 1a is a sectional view of the hot-electron photo transistor according to the present invention. A conductive-type collector layer 2 is formed on a substrate 1. A collector barrier 3 is formed on the collector layer 2. A first conductive-type base layer 4, a resonant tunneling quantum well structure 14 and a second conductive-type base layer 8 are formed on the collector barrier 3 sequentially. The resonant tunneling quantum well structure 14 is formed by stacking a first quantum barrier 5, a quantum well 6, and a second quantum barrier 7 sequentially. Here, two or more than two quantum well structures or quantum dot or quantum wire array structure may be used instead of the resonant tunneling quantum well structure. On the top of the second conductive-type base layer 8, a first non-conductive-type spacer layer 9, a blocking barrier 10, a quantum dot array combination structure 11 and a second non-conductive-type spacer layer 12 are stacked sequentially to form an emitter electron injecting barrier (emitter barrier). A quantum wire array combination structure 11' may be used instead of the quantum dot array combination structure 11. A conductive-type emitter layer 13 is formed on the top of the emitter electron injecting barrier.

Figure 1B:
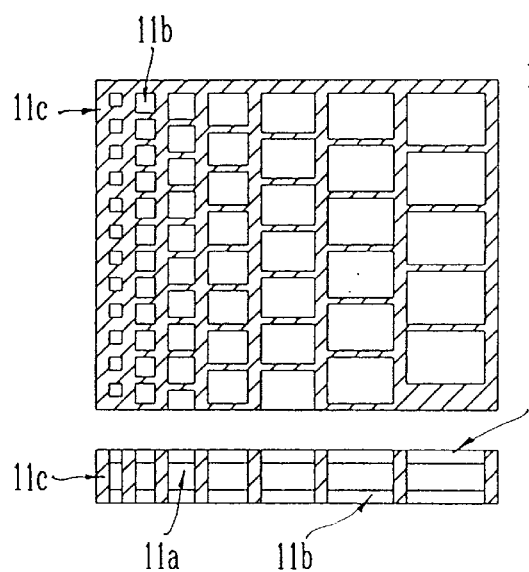
FIG. 1b is a planar sectional view and a lateral sectional view of an example of the quantum dot array combination structure of the hot-electron photo transistor according to the present invention, the structure being applied with the emitter electron injecting barrier structure.

FIG. 1b is a planar sectional view and a lateral sectional view of the quantum dot array combination structure 11 used as the emitter electron injecting barrier. The planar sectional view illustrates that the quantum dot array combination structure 11 is a combination of an insulation layer 11c and quantum dots 11b of various sizes. The lateral sectional view also shows that the quantum dot array combination structure 11 is a combination of quantum dots 11b, a quantum barrier 11a, and quantum dots 11b between the insulation layers 11c.

Figure 1C:
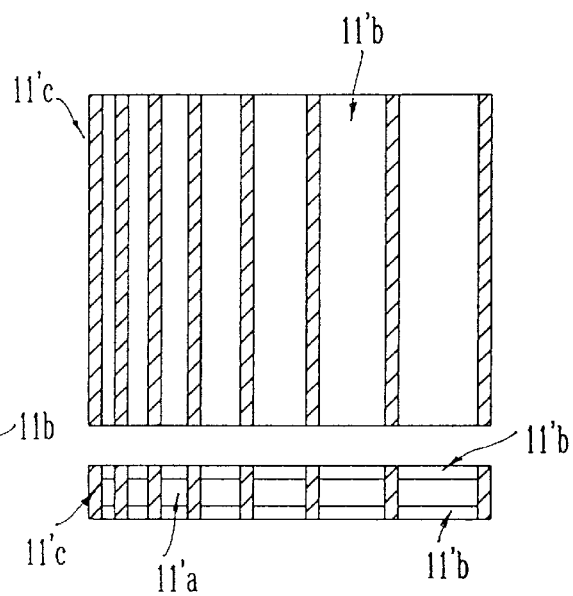
FIG. 1c is a planar sectional view and a lateral sectional view of an example of the quantum wire array combination structure of the hot-electron phototransistor according to the present invention, the structure being applied with the emitter electron injecting barrier structure.

FIG. 1c is a planar sectional view and a lateral sectional view of the quantum wire array combination structure 11' used as the emitter electron injecting barrier. The planar sectional view illustrates that the quantum wire array combination structure 11' is a combination of an insulation layer 11'c and quantum wires 11'b of various line widths. The lateral sectional view also shows that the quantum wire array combination structure 11' is a combination of quantum wires 11'b, a quantum barrier 11'a, and quantum wires 11'b between the insulation layer 11'c.

In the hot-electron transistor according to the present invention, confined energy states of the quantum dots or quantum wires of electrons are controlled by the size of the quantum dots or the width of the quantum wires, thereby the infrared absorption wavelength and the injecting energy of hot-electrons are determined. By constituting quantum dot or quantum wire array combinations of various sizes, various quantum confined states are produced to increase the freedom of controlling and selecting the infrared absorbing range, thereby making it possible to absorb wide range of infrared. In particular, due to the electron transition between quantum confined states which is formed eminently in quantum dots, the resolution to the wavelength of absorbing infrared increases. By utilizing the considerably short transit time of hot-electrons injected to the base layer, and due to the resonant tunneling quantum well structure introduced to the base layer, it is possible to control the frequency of infrared signal to be amplified and processed.

Thus, it is applicable as ultra-high speed tunable infrared signal detectors and amplifiers, and switching and logic devices. For the conductive emitter layer, the collector layer, and the emitter electron injecting barrier structures, the quantum dot or quantum wire array combination with various sizes, the electron blocking barrier, wide spacer layers (buffer layers or potential change absorption layers) are used. The resonant tunneling quantum well structure (first quantum barrier, a quantum well, and second quantum barrier) is introduced to the conductive base layer between the emitter electron injecting barrier and the collector barrier. A collector barrier is formed between the base and the collector.

When the external voltage is applied, an electron tunneling occurs from emitter side to the quantum dot array combination or the quantum wire array combination, and electron transition between the quantum confined states occurs by infrared photos. The electrons excited by the infrared absorption then cause the injection of hot-electrons to the base are a through the barriers and buffer layers due to the potential difference between the emitter and the collector. In the emitter electron injecting barrier structure with infrared detection (absorption), the energy changes of the states caused by stark shift and the resultant frequency changes of the absorbing light can be controlled by the width of the potential change absorbing layer (spacer layer). That is, the introduction of the wide spacer layer reduces the voltage drop in the quantum dot structure caused by the external voltage, thereby make it possible to maintain the absorbing frequency eminently. Here, the inclusion of the blocking barrier next to the infrared absorbing layer effects the cutoff of specific frequencies or the prevention of the dark current. The electrons injected to the base layer are selected by the quantum confined state of the resonant tunneling quantum well of the base layer according to the base voltage and reach the collector layer, or exit as the base current. That is, by the quantum confined state and the external voltage, electrons excited by a specific infrared frequency are selected and filtered to control the collector current.

Figure 2A:
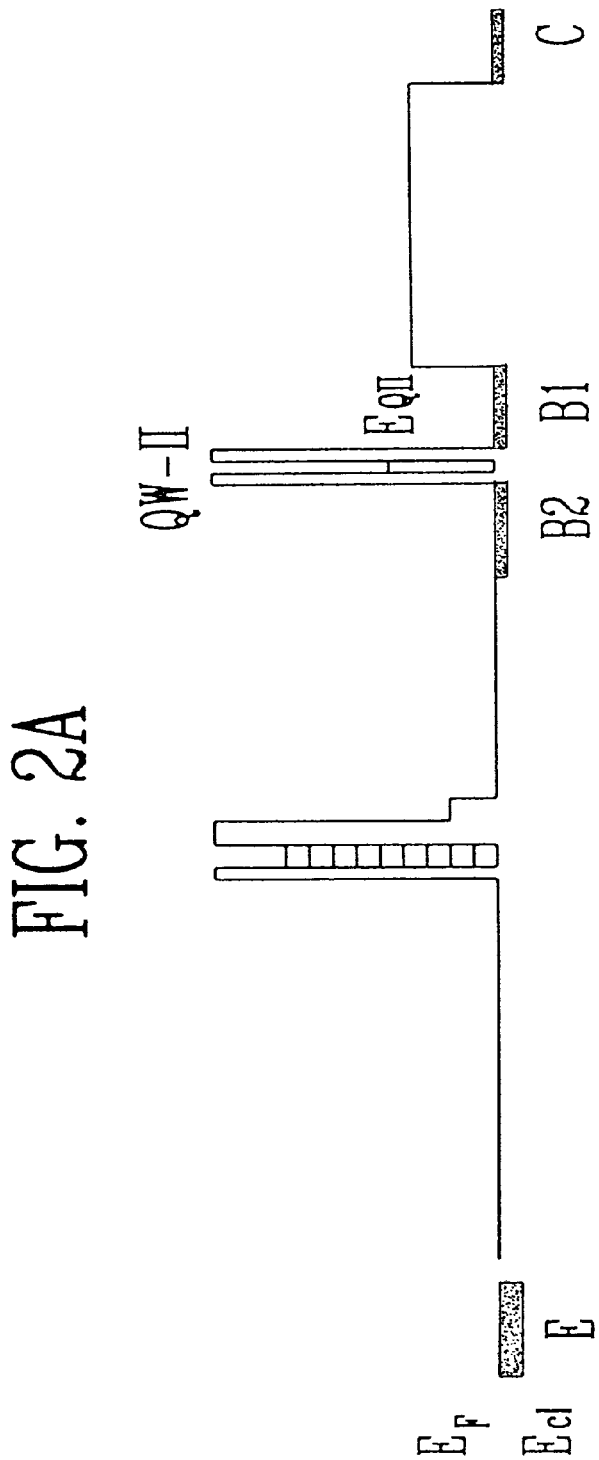

FIG. 2a and 2b show the energy band illustrating conduction bands in each layer under respective voltages of the hot-electron photo transistor according to the present invention.

FIG. 2a shows energy bands of layers constituting the hot-electron phototransistor according to the present invention with no voltage applied (in the thermal equilibrium state) and FIG. 2b is an example of device operating states where it shows the energy bands when the combination of the emitter-base voltage (VEB) and the emitter-collector voltage (VEC) is applied. Electrons in the emitter layer move to the quantum dot array by the resonant tunneling caused by the emitter-collector voltage. Electrons stored in the quantum dot array transit eminently to the excited state by the infrared absorption. The electrons transited to this states pass through the first non-conductive spacer layer (buffer layer) and are injected to the base layer as hot-electrons. Among the electrons arrived at the base layer, those which can resonant tunnel through the quantum confined state EQII of the resonant tunneling structure QW-II of the base layer are selected and arrive at the collector layer. The others fall through the base layer. That is, by the base voltage and the resonant tunneling structure QW-II of the base layer, only those electrons excited by a specific infrared frequency are allowed to pass through contributing to the collector current.

The freedom of selection and combination of various-size quantum dots makes it possible to select and process infrared signals of wide and various range. A similar effect can be attained by replacing the quantum dot array combination structure with the quantum wire array combination structure with various line widths. Further, the non-conductive (undoped) potential change absorption layer plays a role to reduce the potential changes caused by the voltage in the infrared detection quantum dot combination structure, quantum wire structure. Also, since the width of the spacer layer and the blocking layer can be utilized to give the freedom, it can be used to control the energy change of the states caused by the stark shift in the infrared detection quantum well structure and the change of the frequency of the absorbing light. Compared to the conventional symmetric double barrier resonant tunneling structure, the asymmetric structure caused by the introduction of the block barrier induces eminent effect of reducing the current excited by the infrared below the selection frequency or the dark current. The position of buffer layers may be before or after the tunneling double barrier structure of the emitter barrier respectively. The quantum dot or quantum wire array may be used instead of the double barrier resonant tunneling structure of the base layer with infrared frequency selection feature, thus providing with variousness.

According to the present invention, in the heterostructure infrared hot-electron transistor (HET) structure, by applying the combination of quantum dots or quantum wires with various sizes, the wide spacer layers, and the blocking layers to the electron injecting barrier of the emitter, the wide range of infrared detection can be attained and the resolution of the detected infrared wavelength can be increased. And by introducing the resonant tunneling quantum well structure to the base layer the selection, amplification and processing of the specific infrared frequency is possible and the reduction of the dark current is induced. Therefore, the present invention is applicable to ultra-high speed tunable infrared signal detectors and amplifiers, ultra-high speed switching and logic devices, high speed infrared logic devices with new features, new high-speed infrared logic devices which can reduce the number of logic devices.

What is claimed is:

1. A hot-electron photo transistor comprising:

a conductive-type collector layer and a collector barrier formed sequentially on a substrate;

a first conductive-type base layer, a resonant tunneling quantum well structure, and a second conductive-type base layer formed sequentially on said collector barrier;

an emitter electron injecting barrier formed by stacking sequentially a first non-conductive type spacer layer, a blocking barrier, a quantum dot array combination structure, and a second non-conductive type spacer layer on said second conductive-type base layer;

a conductive-type emitter layer formed on said emitter electron injecting barrier.

2. The hot-electron photo transistor according to claim 1, wherein said resonant tunneling quantum well structure is formed by stacking sequentially a quantum barrier, a quantum well layer, and a quantum barrier.

3. The hot-electron photo transistor according to claim 1, wherein said quantum dot array combination structure is formed by combining quantum dots of various sizes, quantum barriers and said quantum dots between insulation layers.

4. The hot-electron photo transistor according to claim 1, wherein two or more than two quantum well structures are used instead of said resonant tunneling quantum well structure.

5. The hot-electron photo transistor according to claim 1, wherein a quantum dot or quantum wire array combination structure is used instead of said resonant tunneling quantum well structure.

6. A hot-electron photo transistor comprising:

a conductive-type collector layer and a collector barrier formed sequentially on a substrate;

a first conductive-type base layer, a resonant tunneling quantum well structure, and a second conductive-type base layer formed sequentially on said collector barrier;

an emitter electron injecting barrier formed by stacking sequentially a first non-conductive type spacer layer, a blocking barrier, a quantum wire array combination structure, and a second non-conductive type spacer layer on said second conductive-type base layer;

a conductive-type emitter layer formed on said emitter electron injecting barrier.

7. The hot-electron photo transistor according to claim 6, wherein said resonant tunneling quantum well structure is formed by stacking sequentially a quantum barrier, a quantum well layer, and a quantum barrier.

8. The hot-electron photo transistor according to claim 6, wherein said quantum wire array combination structure is formed by combining quantum wires of various line widths, quantum barriers and said quantum wires between insulation layers.

9. The hot-electron photo transistor according to claim 6, wherein two or more than two quantum well structures are used instead of said resonant tunneling quantum well structure.

10. The hot-electron photo transistor according to claim 6, wherein a quantum dot or quantum wire array combination structure is used instead of said resonant tunneling quantum well structure.

* * * * *